United States Patent
Schlichting

(10) Patent No.: US 6,900,443 B2
(45) Date of Patent: May 31, 2005

(54) CHARGED PARTICLE BEAM DEVICE FOR INSPECTING OR STRUCTURING A SPECIMEN

(75) Inventor: Hartmut Schlichting, Heimstetten (DE)

(73) Assignee: ICT, Integrated Circuit Testing Geaellschaft fur, Heimstetten (DE)

( * ) Notice: Subject to any disclaimer, the term of this patent is extended or adjusted under 35 U.S.C. 154(b) by 0 days.

(21) Appl. No.: 10/757,354

(22) Filed: Jan. 14, 2004

(65) Prior Publication Data
US 2004/0169140 A1 Sep. 2, 2004

(30) Foreign Application Priority Data
Jan. 16, 2003 (EP) ............................................. 03000677

(51) Int. Cl.[7] ................................................ H01J 37/08
(52) U.S. Cl. ..................... 250/398; 250/310; 250/492.2
(58) Field of Search ................................ 250/398, 310, 250/492.2, 311, 251

(56) References Cited

U.S. PATENT DOCUMENTS

| | | | |
|---|---|---|---|
| 5,139,624 A | 8/1992 | Searson et al. | ........... 204/129.3 |
| 6,066,849 A | 5/2000 | Masnaghetti et al. | ....... 250/310 |
| 6,182,605 B1 * | 2/2001 | Frosien | ................. 118/723 EB |
| 6,576,913 B2 * | 6/2003 | Koyama | ................ 250/492.21 |

FOREIGN PATENT DOCUMENTS

| | | |
|---|---|---|
| EP | 0 969 494 A1 | 1/2000 |
| EP | 1 047 104 A1 | 10/2000 |

OTHER PUBLICATIONS

Frosien, et al., "High Precision Electron Optical System for Absolute and CD–measurements on Large Substrates," Nuclear Instruments and Methods in Physics Research A 363 (1995) 25–30.

European Search Report, dated Jul. 4, 2003 for EP 03000677.9.

* cited by examiner

*Primary Examiner*—Kiet T. Nguyen
(74) *Attorney, Agent, or Firm*—Moser, Patterson & Sheridan

(57) ABSTRACT

The invention provides a charged particle beam device (1) to inspect or structure a specimen (3) comprising a charged particle beam source (5) to generate a charged particle beam (7), a beam optical system (16) to direct the charged particle beam (7) onto said specimen (3) and a gas supply system (10) providing a gas (12) for the charged particle beam device (1), whereby the gas supply system (10) comprises a plurality of at least ten tubes (14; 15; 22) to direct said gas (12) to a desired region (68) for interaction with the specimen (3). The gas support system enables the charged particle beam device to provide sufficient gas for decharging the specimen with a total gas flow which is significantly lower than the total gas flow of charged particle beam devices using previously known gas supply systems. A lower total gas flow helps to improve the vacuum in the charged particle beam region.

26 Claims, 4 Drawing Sheets

CHARGED PARTICLE BEAM DEVICE FOR INSPECTING OR STRUCTURING A SPECIMEN

CROSS-REFERENCE TO RELATED APPLICATIONS

This application claims benefit of German patent application serial number 3 000 677.9, filed Jan. 16, 2003, which is herein incorporated by reference.

BACKGROUND OF THE INVENTION

1. Field of the Invention

The invention relates to a charged particle beam device for inspecting or structuring a specimen by means of a charged particle beam. In particular, the invention relates to a charged particle beam device having means to direct gas towards the specimen.

2. Description of the Related Art

Technologies such as microelectronics, micromechanics and biotechnology have created a high demand for structuring and probing specimens within the nanometer scale. On such a small scale, probing or structuring is often performed with charged particle beams which are generated and focused in charged particle beam devices. Examples of charged particle beam devices are electron microscopes as well as electron or ion beam pattern generators. Charged particle beams, in particular ion and electron beams, offer superior spatial resolution compared to photon beams, due to their short wave lengths at a comparable particle energy.

While charged particle beam devices are able to meet high spatial resolution requirements, they often carry the disadvantage that they charge the specimen in the region where the primary charged particle beam impinges onto the specimen during a scan. Charging of the specimen is particularly severe if the surface of the specimen comprises electrically insulating or poorly conducting material, such as biological tissue, or oxide regions of a semiconductor integrated circuit. In these cases, diversion of the excess charge generated by the impinging charged particle beam on the specimen is so slow that the charging generates potentials on the specimen surface that are high enough to deform or deflect the impinging charged particle beam. As a consequence, a scan of the charged particle beam over the specimen is distorted which in turn deteriorates the spatial resolution of the charged particle beam device.

Charging is even more difficult for charged particle beam devices that inspect a specimen through the detection of secondary charged particles generated by the charged particle beam on the specimen. The potentials near the surface of the specimen generated through charging can prevent secondary charged particles from escaping from the surface, or deflect them in a way that they do not reach the sensitive area of the detector. Both lead to a loss of spatial resolution for the inspection.

There have been several techniques developed to reduce charging. One of them is to adjust the energy of the primary charged particles to a value where the emission rate of secondary charged particles balances the flux of the incoming charged particle beam, as described e.g. U.S. Pat. No. 6,066,849. In this case, excess charge in the regions of beam incidence can be kept close to zero. However, this technique does not allow the energy of the charged particle beam to be freely chosen which in turn excludes many useful applications in the field of charged particle beam microscopy and structuring.

Another technique to reduce charging of a specimen has been proposed in patent application EP 0 969 494 A1. The technique uses a gas supply system to introduce a gas by means of a gas nozzle into the electron beam near the specimen. The gas picks up some or all of the excess charge from the specimen when it comes in contact with the surface of the specimen. The higher the concentration of the ionized gas near the specimen, the higher the decharging rate.

It should be mentioned that the use of a gas supply system near the specimen is not limited to a decharging of the specimen. Instead, the gas may also be used to interact with the specimen in some other way. For example, the gas may be used to etch the specimen or to provide a material layer (vapor deposition) in the region where the charged particle beam impinges onto the specimen.

Decharging, etching or depositing with present gas supply systems, however, requires a significant amount of gas to be injected into the vacuum. This can load the vacuum pump to such a degree that it damages the pump. In addition, the introduced gas worsens the overall vacuum and widens the focus of the charged particle beam due to collisions between the charged particle beam and the gas. Further, the large amount of gas near the high electric fields of the beam optical lens can lead to arcing which destroys the beam optics.

SUMMARY OF THE INVENTION

It is therefore a first aspect of the present invention to provide a charged particle beam device which avoids the above mentioned problems.

It is further a second aspect of the present invention to provide a charged particle beam device which is capable of decharging the specimen.

It is further a third aspect of the present invention to provide a charged particle beam device where a gas is provided for interaction with the specimen.

This and other problems are solved by a charged particle beam device according to claim 1.

Further advantages, features, aspects and details of the invention are evident from the dependent claims, the description and the accompanying drawings. The claims are intended to be understood as a first non-limiting approach of defining the invention in general terms.

The invention according to claim 1 provides a charged particle beam device with a gas supply system that comprises a plurality of at least ten tubes in order to direct the gas to interact with the specimen. The plurality of tubes serves to direct the gas particles with a high peaking-ratio. The higher the number of tubes, the higher the peaking ratio at a given total inner cross section of all tubes combined. A high peaking ratio in turn facilitates directing the gas with high precision towards a desired region, i.e. a high peaking ratio facilitates a high aiming accuracy.

The present invention is based on the idea that one can employ the high aiming accuracy of a plurality of tubes for providing sufficient gas in a desired region for interaction with the specimen without significantly worsening the vacuum surrounding the desired region. Since the gas is needed in a small region only, e.g. within the charged particle beam in the vicinity of the specimen, the total gas flow can be reduced significantly when the gas is directed precisely into the desired region without spreading the gas in regions outside of the desired region. Therefore, the plurality of the at least ten tubes can be used to increase the gas pressure within the small desired region, while maintaining the overall gas pressure at a level low enough to operate the charged particle beam device without significant loss of device performance.

According to the invention, the gas supply system comprises a plurality of at least ten tubes to direct the gas towards a desired region for interaction with the specimen. The interaction of the gas with the specimen refers to any interaction which alters the surface of the specimen, like e.g. etching, charging or decharging of the specimen or deposition. Preferably, the interaction of the directed gas with the specimen is accompanied by an interaction of the gas with the charged particle beam. For example, the directed gas may be ionized by the charged particle beam before the ionized gas alters the surface of the specimen.

Preferably, the desired region according to claim 1 represents the volume taken by the charged particle beam and/or the region where the charged particle beam impinges onto the specimen. In this case, some or all of the gas becomes ionized by the charged particle beam before it interacts with the specimen. In one preferred embodiment of the invention, the ionized gas is used to decharge the specimen. In another preferred embodiment of the invention, the ionized gas is used to perform a chemical reaction with the surface of the specimen to etch the surface of the specimen. In yet a third preferred embodiment of the invention, the ionized gas becomes deposited onto the specimen.

The peaking-ratio is defined as the ratio of a given forward direction intensity of a given gas flow at the outlet of a tube into a vacuum compared to the forward direction intensity of the same gas flow assuming an angular cosine distribution. An angular cosine distribution represents the distribution of a gas flow where the gas particles have a fully randomized motion at the outlet of the tube. A peaking-ratio larger than 1, therefore, represents a gas flow where, at the outlet, the gas particles are directed within a smaller forward angle compared to the forward angle of a cosine distribution. Therefore, a gas flow with a high peaking-ratio facilitates directing the gas with high spatial precision towards a desired region (high aiming accuracy). Therefore, a high peaking-ratio allows the total gas flow to be reduced by the peaking-ratio in order to obtain the same gas concentration at a desired location, if the desired location is small compared to the extension of the gas flow beam. The reduced total gas flow in turn helps to maintain a better vacuum in the area surrounding the charged particle beam.

A gas injection with a high peaking-ratio further suppresses arcing in the beam optical system since the reduced gas flow reduces a diffusion of the gas into the electrode or magnet regions of the beam optical system. Gas in the beam optical system can ignite sparks which damage electrodes and magnets.

The gas supply system according to the invention provides a high peaking-ratio because of the plurality of at least ten tubes. The concept is based on the discovery that the collision rate between the gas particles of the gas (gas-gas collisions) compared to the collision rate between the gas particles and a tube wall (gas-wall collisions) becomes smaller the higher the number of tubes, provided that the total inner cross section area, $A_T$, and the dispensing pressure is the same. For example, replacing one tube having an inner cross section area, A, by many smaller tubes in parallel that as a sum have the same total inner cross section area, $A_T$, reduces the gas-gas collision rate. A lower gas-gas collision rate increases the peaking-ratio, since gas-gas collisions randomize gas particle motion directions, while gas-wall collisions generally preserve the motion of the gas particles in tube direction.

The inner cross section area, A, of a tube refers to the cross section of the tube through which the gas can flow. The total inner cross section area, $A_T$, refers to the sum of cross section areas, A, of all tubes through which the gas can be directed into the charged particle beam. In the case that there is only one tube to direct the gas into the charged particle beam, the total inner cross section area, $A_T$, is equal to the inner cross section area, A. Preferably, if the inner cross section area, A, of a tube varies along its longitudinal axis, the inner cross section area refers to the inner cross section area at the outlet of the tube.

The charged particle beam devices according to the invention can be any charged particle beam device wherein a charged particle beam is used to inspect a specimen, e.g. an electron microscope such as a Secondary Electron Microscope (SEM), Transmission Electron Microscopes (TEM) or any other charged particle beam device that uses detectors to detect secondary particles generated by the charged particle beam on the specimen. In addition, the charged particle beam device according to the invention can also be a pattern generator which generates a pattern on the specimen by means of an electron or ion beam.

The specimen can be any physical body that is meant to be inspected or structured with high spatial resolution. Preferably, the spatial resolution is high enough to resolve structures in the sub-micron range. In particular, the specimens can be semiconductor wafers, integrated circuit devices, micromechanical devices, data storage devices or biological tissues.

The charged particle beam device according to the invention further comprises a charged particle beam source to generate the charged particle beam. Preferably, the charged particle beam is an electron beam which is easy to generate compared to an ion beam, or an ion beam which generally provides higher spatial resolution and better absorption by the specimen. The charged particle beam source can be any device that is able to emit a current of charged particles, i.e. an electron current or ion current, into a vacuum. For the purpose of inspection, the charged particle beam current is preferably in the range between 1 pA and 100 nA, depending on the kind of specimen and the spatial resolution needed.

The preferred charged particle beam sources for electron beams are thermionic electron guns, e.g. tungsten hairpin emitters or lanthanum hexaboride electron guns, as well as field emission electron guns. These charged particle beam sources are known to those skilled in the art and well tested in many different fields of applications. However, the invention is not depending on the choice of charged particle beam source; therefore, other types of charged particle beam sources, e.g. ion beam sources or electron field emitter arrays, are within the scope of the invention as well.

The charged particle beam device according to the invention further comprises a beam optical system to direct the charged particle beam onto said specimen. The beam optical system preferably comprises electrodes and magnets to accelerate the charged particles emitted from the charged particle beam source, in order to direct the charged particle beam towards a position on the specimen and/or to focus the charged particle beam onto the specimen. More precisely, the beam optical system preferably includes an anode to accelerate the charged particle beam to a desired energy, apertures to limit the opening angle of the charged particle beam, a condensor to generate a small crossover of the charged particle beam, deflectors to scan the charged particle beam over various positions of the specimen and/or a final focus lens (objective lens) to focus the charged particle beam onto the specimen.

Once the charged particle beam impinges onto the specimen, the excess charge on the specimen is usually increased and, consequently, the potential of the specimen changed ("charging"). The potential changes on the specimen can have deteriorating effects on the incoming charged particle beam and the spatial resolution of the charged particle beam device. Therefore, it is generally sought to minimize charging of the specimen during inspection or structuring. Minimizing the charging, however, requires providing means to disperse the excess charge from the specimen.

In one preferred embodiment of the invention, the charged particle beam device according to the invention comprises a gas supply system to decharge the specimen. In this case, preferably, the gas is directed into the charged particle beam. When the gas crosses the charged particle beam, the gas becomes partially or fully ionized. Once the ionized gas reaches the surface of the specimen, it is able to pick up at least some of the charge of the specimen, and thus decharges the specimen. Similarly, when the gas is directed onto the specimen, some of the neutral gas is able to pick up charge from the specimen in order to decharge the specimen.

The gas supply system according to the invention comprises at least ten tubes in order to increase the peaking-ratio relative to the peaking-ratio of a gas supply system with one tube having the same gas supply capability. An increased peaking-ratio improves the aiming accuracy in order to focus the gas into the charged particle beam. This in turn allows the total gas flow to be reduced to achieve the same decharging capability on the specimen.

Preferably, the at least ten tubes are connected in parallel with each other. The term "connected in parallel" refers to the language describing an electrical circuit having electrical components "connected in parallel". "Connected in parallel" refers to the fact that the gas current can pass through only one of the at least ten tubes. In other words, the gas flow is distributed among the at least ten tubes when the tubes are "connected in parallel". Having the at least ten tubes connected in parallel allows the gas pressure (dispensing pressure) to be reduced for the same total gas flow. A low dispensing pressure at the tubes helps to increase the peaking-ratio.

Preferably, the gas of the gas supply system enters through the inlet into the tube and exits the tube through the outlet of the tube. Preferably, the gas exits the outlet of the tube into the vacuum of the charged particle beam. Preferably, the inlet of the tube is at a position where the gas enters from a dispensing pressure chamber into the tube. If the tube is not connected to a dispensing pressure chamber, the inlet of the tube is preferably at the position where the inner wall of the tube connects with an inner wall of another one of the at least ten tubes. Preferably, the length, L, of a tube of the at least ten tubes is defined as the length between the outlet of the tube and the inlet of the tube.

Preferably, the inner cross section area of each tube of the plurality of tubes varies along the tube length by less than a factor of 64, preferably by less than a factor of 16 or 4, and even more preferred by less than a factor of 2 compared to the inner cross section area, A, at the outlet of the tube. In another preferred embodiment, the inner cross section area of each tube varies by less than 10%. The inner cross section area, A, of a tube is defined as the cross section of the tube within which the gas can flow. Preferably, the longitudinal tube axes of each tube of the at least ten tubes are straight lines to provide that it is possible to "look through" the tubes.

Preferably, the gas supply system injects the gas into the charged particle beam by means of a pressure difference between the inlets of the at least ten tubes and the outlets of the at least ten tubes. Preferably, the pressure at the inlets of the at least ten tubes is higher than the pressure at the outlets of the at least ten tubes in order to inject the gas into the vacuum surrounding the charged particle beam. The pressure at the inlets of the tubes is also called "dispensing pressure" since the dispensing pressure can be used to control the gas flow dispensed from the tube into the vacuum of the charged particle beam device.

The smaller the dispensing pressure the more "transparent" a given plurality of tubes appears to the gas due to the increasing free path length, $\lambda$, of the gas. More precisely, if the free path length, $\lambda$, is significantly larger than the diameter and the length of a tube, the gas within the tube behaves like a gas in the "molecular gas region". In this case, the peaking-ratio is in the region of or larger than $\frac{3}{4}$ (L/D) where D is the characteristic diameter of the tubes. (The characteristic diameter, D, of a tube is defined as the smaller of the two diameters of an ellipsoid that best fits the contour of the inner cross section area, A, of the tube, e.g. for a tube with a circular inner cross section area, the characteristic diameter, D, is equal to the circle diameter; for a tube with an ellipsoidal inner cross section area, the characteristic diameter, D, is the small axis of the ellipsoid).

If the free path length, $\lambda$, is smaller than the length of the tube but larger than the diameter of the tube, the gas within the tube behaves like a gas in the "opaque region". In this region, the peaking-ratio decreases to almost 1 with decreasing free path length. If the free path length, $\lambda$, becomes smaller than the diameter of the tube, the gas in the tube is said to be in the "laminar region" where the peaking ratio is 1. Finally, with even further decreasing free path length, $\lambda$, the gas shows turbulent behavior ("turbulent region").

Therefore, the larger the free path length of the gas the larger the peaking-ratio. With a large peaking-ratio, the total gas flow necessary to decharge the specimen can be reduced which further allows the dispensing pressure to be reduced. Preferably, during normal operation, the dispensing pressure is smaller than 10 mbar, preferably smaller than 1 mbar and even more preferred smaller than 0.1 mbar. "Normal operation" refers to a standard operational mode of the charged particle beam device where the charged particle beam is switched on and the gas supply system is used to direct gas towards a desired region for interaction with the specimen.

Preferably, the inlets of the plurality of tubes are exposed to a same dispensing pressure. This way, the plurality of tubes can be connected to a single dispensing pressure chamber which facilitates an easy mounting of the tubes and easy control of the total gas flow rate.

Preferably, the charged particle beam device provides a vacuum in the region of the charged particle beam with a pressure lower than $1 \times 10^{-3}$ mbar and preferably lower than $1 \times 10^{-4}$ mbar with the gas supply system switched off. The lower the pressure near the charged particle beam the lower the collision rate of the charged particles with the residual gas in the vacuum, which at a higher pressure would widen the charged particle beam and deteriorate the spatial resolution performance of the charged particle beam device. Preferably, said vacuum is provided in the region between the outlets of the plurality of at least ten tubes and the charged particle beam.

Preferably, the gas supply system comprises a plurality of more than 100, preferably more than 1000 and even more preferred more than 10,000 tubes to direct said gas into said charged particle beam. The higher the number of tubes at a given total inner cross section area, $A_T$, of the tubes, the smaller the gas-gas collision rate compared to the gas-wall collision rate and, accordingly, the higher the peaking-ratio. Preferably, the number of tubes at a given total inner cross section area, $A_T$, is at least large enough to reduce the gas-gas collision rate to the point where the free path length of the gas in the tubes is larger than the characteristic diameter, D, of the tubes.

Even more preferred, the number of tubes at a given total inner cross section area, $A_T$, is at least large enough to reduce the free path length of the gas in the tubes to the point where the free path length of the gas is larger than the length, L, of the tubes. In this case, the peaking-ratio is essentially given by the length, L, and the diameter, D, of the tubes, i.e. by ¾ (L/D). Under such conditions, the gas flow is called "molecular flow". In this case, the gas passes through the tube with hardly any gas-gas or gas-wall collisions, and the gas can be focused within a particularly small forwarding angle.

An upper limit for the number of tubes is given by a minimum inner tube cross section area, A, of the tubes. At a decreasing inner tube cross section area, the conductance of the tubes decreases. This implies that the dispensing pressure has to be increased in order for the gas supply system to provide a sufficient total gas flow. However, at some point, an increasing dispensing pressure decreases the peaking-ratio.

Another upper limit of tubes for the number of the plurality of tubes is given by the fact that in order to achieve a higher peaking ratio, the tubes have to be sufficiently straight. Sufficiently straight refers to the requirement that the tubes have to be straight enough that gas particles can pass through the tubes in a straight line without colliding with the tube wall. Technically, however, it is difficult to fabricate tubes of a sufficient tube length. L, with a diameter, D, of less than say 1 $\mu$m which ensure that gas particles can pass through the tubes without wall collisions. Therefore, the density of the tubes is preferably smaller than $10^8$ 1/cm$^2$.

Preferably, each tube of the plurality of tubes has an inner cross section with an area, A, smaller than 50,000 $\mu m^2$, preferably smaller than 1000 $\mu m^2$ and even more preferred smaller than 10 $\mu m^2$. The inner cross section refers to the cross section of the tube through which the gas can pass. The smaller the cross section area, the easier it is for the gas supply system to operate the tubes in the "molecular gas" mode, i.e. the mode at which the free path length of the gas in the tubes at a given pressure is longer than the characteristic diameter, D, of the tube.

Preferably, the length, L, of each tube is larger than the square root of the inner cross section area, A, of the tube by more than 10 times, preferably by more than 50 times and even more preferred by more than 100 times. The longer the tubes relative to their inner cross section area, A, the higher the achievable peaking-ratio. If the tubes have a round cross section, it is preferred that the length, L, of each tube is larger than the diameter of the inner cross section of the tube by more than a factor of 10, preferably more than a factor of 50 and even more preferred by more than a factor of 100.

Preferably, the inlets of the tubes of the plurality of tubes are positioned within a dispensing pressure chamber. Preferably, the dispensing pressure chamber provides the gas to the tubes. Preferably, the gas in the dispensing pressure chamber is at a dispensing pressure which enables the tubes to direct the gas into the charged particle beam. Preferably, the dispensing pressure is controlled by means of a pressure control unit. Preferably, the dispensing pressure chamber is connected with a gas supply unit from which the dispensing pressure chamber receives the gas. This way the dispensing pressure chamber can be provided with the gas over a long operational time. Preferably, the pressure control unit adjusts the pressure of the gas coming from the gas supply unit to the dispensing pressure necessary to generate a desired gas flow through the tubes. Preferably, the dispensing pressure chamber is a container holding the gas having a chamber inlet at the pressure control unit where the gas flows into the container, and a chamber outlet at the tubes where the gas exits the container. Preferably, the volume of the dispensing pressure chamber is defined as the gas volume in the dispensing pressure chamber between tube inlets and pressure control unit. Preferably, the volume of the dispensing pressure chamber is larger than the total volumes of the tubes that are connected to the container by a factor of 5, preferably by a factor of 10 and even more preferred by a factor of 100. In this way, the dispensing pressure chamber is able to provide a constant dispensing pressure over all inlets of the tubes.

Preferably, the inlets of the tubes of the plurality of tubes are positioned within a common dispensing pressure chamber. This concept allows for an easy mounting of the plurality of at least ten tubes to the gas supply system. In this way, the inlets of the tubes can be exposed to the same dispensing pressure which facilitates an easy gas flow through each of the tubes, if the geometry of the tubes is the same. The inlet of a tube is the opening of the tube where the gas enters from the dispensing pressure chamber into the tube.

Preferably, the at least ten tubes are oriented essentially in parallel to each other. Even more preferred, the tubes of the plurality of tubes are arranged as a bundle of tubes. A bundle of tubes refers to a plurality of tubes which are oriented essentially in parallel to each other (less than 10 degrees and preferably less than 1 degree deviation) and where the tubes adjoin with one another to form a structure that is mechanically more rigid than individual tubes. Further, a bundle of tubes allows many tubes to be packed within a limited space. Preferably, the longitudinal axes of the tubes overlap each other in a longitudinal projection.

In another preferred embodiment of the invention, the tubes are not parallel but tilted with respect to each other in order to focus the gas more precisely onto a common point or a common axis. Preferably, the common point or common axis are positions on the trajectory along which the particle beam passes by when the charged particle beam device is operated.

In one preferred embodiment of the invention, the bundle of tubes are made of many tubes that are glued together in parallel to form a tube plate, with the tubes reaching from the front side of the tube plate to the reverse side of the tube plate. In this case, the tube inlets are on the front side of the tube plate and the tube outlets are on the reverse side of the tube plate. This tube arrangement provides a mechanically rigid system.

Preferably, the density of tube outlets on the reverse side of the tube plate is within the range of $10^2$ 1/cm$^2$ to $10^7$ 1/cm$^2$ and even more preferred within $10^4$ 1/cm$^2$ to $10^6$ 1/cm$^2$. The high density of tubes allows many tube outlets to be arranged closely to the trajectory of the charged particle beam in the region where the beam impinges onto the specimen. On the other hand, an upper limit for the tube density ensures that the inner tube cross sections are large enough to provide a sufficient conductance.

Preferably, during normal operation, the free path length, $\lambda$., of the gas at the outlet of each tube is larger than the characteristic diameter, D, of the tube, preferably larger by more than $1/10$ of the length of the tube, L, and even more preferred by more than one time of the length of the tube, L. The larger the free path length, $\lambda$., the better the gas can be focused within a small angle, since the number of gas-gas collisions does not dominate the gas transport in the tube.

Preferably, during normal operation, the peaking-ratio of the gas at the outlet of each tube is larger than two, more preferably larger than five or ten and even more preferred larger than fifty. A high peaking-ratio helps to decrease the emission angle within which the gas exits the outlet of a tube. A small emission angle in turn helps to direct the gas into the charged particle beam with high spatial precision which allows to reduce the gas flow necessary for the decharging of a specimen.

Preferably, the beam optical system comprises a final focus lens to focus the charged particle beam onto the specimen. The final focus lens serves to focus the charged particle beam onto a small spot size on the specimen to provide a high spatial resolution for structuring or inspecting the specimen. Preferably, the final focus lens is the mechanical component of the beam optical system which is closest to the specimen.

Preferably, the distances between the outlets of each of the at least ten tubes and the optical axis of the final focus lens are smaller than 50 mm, preferably smaller than 10 mm and even more preferred smaller than 5 mm. The shorter the distance between the optical axis and outlets of the tubes, the smaller the diffusion of the gas on its way from the outlet to the charged particle beam. In this way, the ionization efficiency, i.e. the fraction of the gas that becomes ionized in the charged particle beam compared to the total amount of gas injected into the vacuum, can be improved.

Preferably, during normal operation, the plurality of tubes directs the gas into the charged particle beam within the region between the final focus lens and the surface of the specimen. This region also includes the region of incidence, i.e. the region where the charged particle beam impinges onto the specimen. Interactions of the gas with the charged particle beam being so close to the specimen maintain a low level of widening of the charged particle beam. Further, a high fraction of the gas that becomes ionized in the charged particle beam so close to the specimen arrives at the surface of the specimen to etch or decharge the specimen.

Preferably, the tubes of the plurality of tubes are arranged at an angle, a, smaller than 60°, preferably smaller than 40°, and even more preferred smaller than 20° with respect to the optical axis of the final focus lens to direct the gas towards the specimen. The smaller the angle a, the larger can the crossing volume of the beam of the gas with the charged particle beam be made. A large crossing volume helps to increase the ionization efficiency. Further, with a small angle $\alpha$, the gas exits the outlets of the at least ten tubes in the direction of the specimen. Both factors help to increase the rate of ionized gas particles arriving at the surface of the specimen to interact with the specimen.

Preferably, the beam optical system comprises a reference electrode to generate an electric field which in turn accelerates the ionized gas towards the specimen. In this way, the decharging efficiency of the specimen can further be improved. Preferably, for charged particle beam devices which comprise a decelerating electrode to slow down the charged particle beam just before impinging the specimen, reference electrode and decelerating electrode are one unit; this is because an electrode which decelerates the electrons on their way to the specimen, at the same time, accelerates gas atoms that have lost electrons due to gas-electron collisions within the charged particle beam. Further, charged particle beam devices which use high voltage beam columns for accelerating the charged particle beams to high energies during the transport through the beam optical system preferably have the high voltage beam column, the decelerating electrode and the reference electrode combined to form one electrode.

In one preferred embodiment of the invention, the plurality of the at least ten tubes is arranged circularly around the axis along which the charged particle beam travels to direct the gas onto the charged particle beam from different directions. In this way, a high number of tubes can be arranged in parallel with each other while minimizing an overlap of the focused gas beams with each other. An overlap of gas beams would create a high collision rate of the gas particles that would cause a defocusing of the gas beams.

In another preferred embodiment, the plurality of tubes comprises at least two tube plates and even more preferred at least three tube plates. Several tube plates allow the gas to be directed from different directions. Using several tube plates allows for a good compromise between (a) using tube plates to use their high tube density capabilities and (b) the flexibility to arrange each tube plate with an optimum angle alignment to focus the gas into the trajectory of the charged particle beam.

Preferably, the tube plates are arranged in radial directions on a circular line coaxially surrounding the optical axis of the final focus lens. This arrangement allows many tube plates to be placed near the charged particle beam with the tubes directing the gas towards the charged particle beam. The higher the number of tubes at a given total inner tube cross section area, $A_T$, the easier it is to operate the gas supply system at a dispensing pressure where the tubes seem "transparent" to the gas ("high peaking-ratio"). This in turn allows the gas flow rate to be reduced while still meeting the minimum gas pressure requirements within the desired region, e.g. within the charged particle beam to decharge the specimen efficiently.

Even more preferred, the tube plates are arranged in radial directions on a semi-circular line coaxially surrounding the optical axis of the final focus lens. In this way, space opposite to the semi-circular region is left free for the injected gas to flow away from the interaction region once it has passed through the charged particle beam. The removal of the gas that has passed through the charged particle beam is important for minimizing the amount of gas in the vacuum. In addition, the semi-circular arrangement of the tube plates offers the advantage that the space opposite to the semi-circle is left free to allow for tilting the beam optical system to access the area between the specimen and the final focus lens, e.g. for replacing a specimen.

Preferably, the gas is a neutral gas when passing through the at least ten tubes. In this way, the gas can be directed toward the charged particle beam without being affected by electric or magnetic fields nearby. Further, once the gas has passed through the charged particle beam, the ionized particles of the gas become separated from the neutral gas particles since the charged specimen attracts the ionized gas particles. In this way, the neutral gas particles can be removed easily by the gas pump to keep the vacuum level high, while the ionized gas particles drift towards the specimen where they discharge the surface of the specimen.

Preferably, the neutral gas is $N_2$, an inert gas like He, Ne, Ar, Kr or Xe or $CH_4$ or a mixture of the above mentioned gases. The choice of gas depends on the ionization potential of the gas, chemical compatibility with the specimen and the charged particle beam device, and costs. Preferably, the gas is chosen to have a low ionization potential in order to achieve a higher ionization level of the gas during interaction with the charged particle beam.

Preferably, the plurality of the at least ten tubes is positioned in the vicinity of the specimen. Even more preferred, the plurality of the at least ten tubes is positioned in the vicinity of the spot where the charged particle beam impinges onto the specimen. In this way, the distance that the gas has to travel from the outlet of the at least ten tubes to the specimen is small in order to minimize a widening of the gas beam. Preferably, the distance between the point of interaction of the specimen with the charged particle beam and the outlets of the tubes is smaller than ten times the length of the tubes and even more preferred smaller than two times the length of the tubes.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE PREFERRED EMBODIMENT

Figure 1:
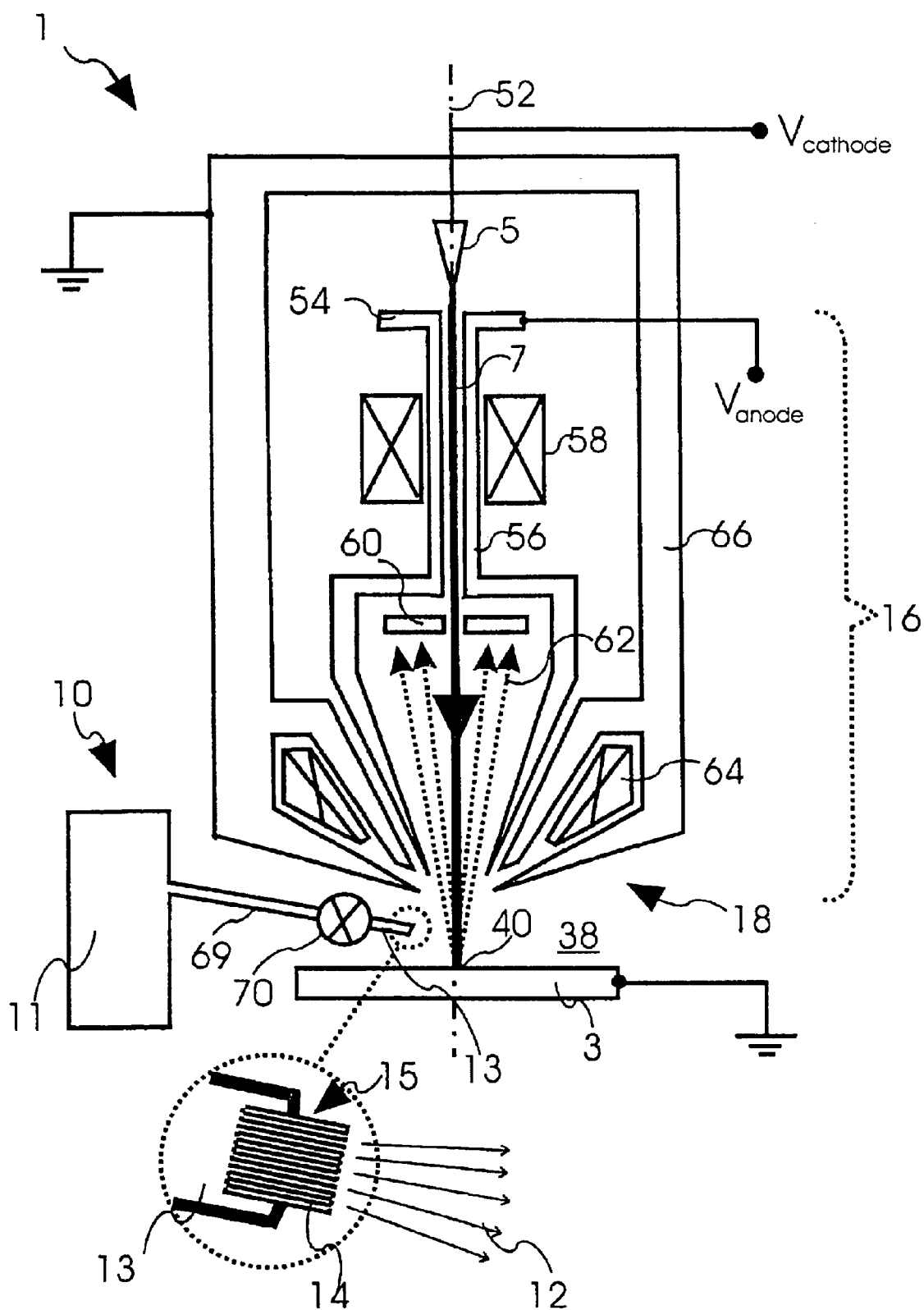
FIG. 1 shows schematically a charged particle beam device with a gas supply system according to the invention.

FIG. 1 schematically shows an example of a charged particle beam device 1 according to the invention. In this embodiment the charged particle beam device is a Scanning Electron Microscope (SEM) where the gas supply system 10 is used to decharge the specimen 3 during inspection of the specimen 3, which in this case is a semiconductor wafer 3. However, this example is non-limiting in that the gas supply system 10 can also be used to etch the specimen in the region where the charged particle beam 7 impinges onto the specimen 3, or to deposit the gas atoms of the gas in the region where the charged particle beam 7 impinges onto the specimen 3.

The SEM of FIG. 1, with the exception of the gas supply system 10, is described in more detail in the publication by J. Frosien, S. Lanio and H. P. Feuerbaum "*High Precision electron optical system for absolute and CD-measurements on large substrates*", Nuclear Instruments and Methods in Physics Research A 363 (1995) 25–30. The SEM 1 of FIG. 1 is shown to generate a charged particle beam 7 by means of a charged particle beam source 5 which, in this embodiment, is an electron gun, e.g. a triode gun with a tungsten thermionic filament or, alternatively, a brighter emitter such as lanthanum or cerium hexaboride. Another option is e.g. a thermal field emission (ZrO/W) emitter where the electron emission is initialized by an electrical field between the tip and the extractor electrode (not shown) or various other kinds of field emission guns.

The electron gun 5 generates a charged particle beam 7 which in this embodiment is an electron beam. The electron beam 7 is accelerated by the anode 54 to an energy of about 10 keV and guided through the high voltage beam column 56 towards the specimen 3. The high voltage beam column 56 serves to keep the electron beam 7 at a high energy before it is decelerated in the final focus lens 18. The high energy during the electron beam passage through the beam optical system 16 helps to minimize diffusion and spreading of the electron beam 7 during passage due to disturbing electrical fields.

In addition to the above mentioned components, the beam optical system 16 in FIG. 1 comprises a condensor 58 and a final focus lens 18 to focus the electron beam 7 onto the specimen 3. The final focus lens 18 in this embodiment focuses the electron beam by means of a combination of a magnetic field generated by the final focus magnet coil 64 and an electric field generated by the voltage between the specimen 3 and the high voltage beam column 56. The high voltage beam column 56 is electrically connected to the anode 54 in order to provide an electric field free region for transporting the electron beam 7 towards the specimen 3. In the region between the final focus lens 18 and the specimen 13, the electron beam 7 becomes decelerated to a desired intermediate energy at which the specimen is meant to be inspected. It is for the clarity of the drawing that the beam optical system 16 in FIG. 1 shows only some of the components that are usually implemented in an SEM. For example, it does not show apertures or a deflector necessary to scan the electron beam over the specimen 3. However, a detailed list of components of an SEM depends on the application of the SEM, and a person skilled in the art has to decide which components to implement into the SEM.

The SEM 1 further comprises a detector 60 to detect the secondary particles 62 that the electron beam 7 generates on the specimen 3. The signals detected at the detector 60 serve to reconstruct images of the area of the specimen 3 that the electron beam has scanned. In this embodiment, the detector 60 closely surrounds the path of the electron beam 7 in order to be able to detect the high rate of the secondary particles that are almost back-scattered at an angle of 90°. This is only possible because of the design of the final focus lens 18, which allows the secondary particles 62 to pass through the final focus lens 18 to the detector 60.

The vacuum chamber that provides the vacuum 38 for the electron beam in the region between the final focus lens 18 and the specimen is not shown in FIG. 1; however, the vacuum chamber together with the vacuum pumps are able to provide a vacuum 38 of better than $10^{-3}$ mbar and preferably less than $10^{-4}$ mbar in the region between the final focus lens 18 and the specimen.

FIG. 1 further shows an example of the gas supply system 10 comprising a gas supply unit 11, a gas pipe 69, a pressure control unit 70 to reduce the pressure in the gas supply unit 11 to a desired dispensing pressure in the dispensing pressure chamber 13 and a plurality of tubes 15 comprising at least ten tubes 14. The dispensing pressure chamber 13 in FIG. 1 is the chamber between the pressure control unit 70 and the inlets of the plurality of tubes 15. In one preferred embodiment, the gas volume of the dispensing pressure chamber 13 is larger than the total volume of the plurality of tubes 15 by a factor of 10 in order to provide a constant dispensing pressure over all tubes 14. Also, it is preferred that the tubes have the same characteristic diameter, D, within 10%.

In FIG. 1, the gas pipe 69 transports the gas 12 from the gas supply unit 11 to the pressure control unit 70, which provides the desired dispensing pressure necessary to deliver the required total gas flow through the plurality of the at least ten tubes 15.

The required total gas flow through the plurality of tubes 15 depends on many factors, e.g.:

a) the surface material of the specimen 3, since the surface material determines to what degree the specimen 3 charges due to the impinging electron beam 7. The higher the charging of the specimen the higher the demand for fast decharging;

b) the current of the electron beam 7 which charges the specimen 3;

c) the geometry of the region between the objective lens 18 and the specimen 3, since the geometry of the region determines how fast the injected gas 12 is removed by the surrounding vacuum 38. The efficiency of the gas removal from the region between the objective lens 18 and the specimen 3 by the surrounding vacuum can be specified by a conductance value; and d) the peaking-ratio which determines how precisely the gas can be directed into the desired region, i.e., the charged particle beam or the region of incidence.

Figure 2A:
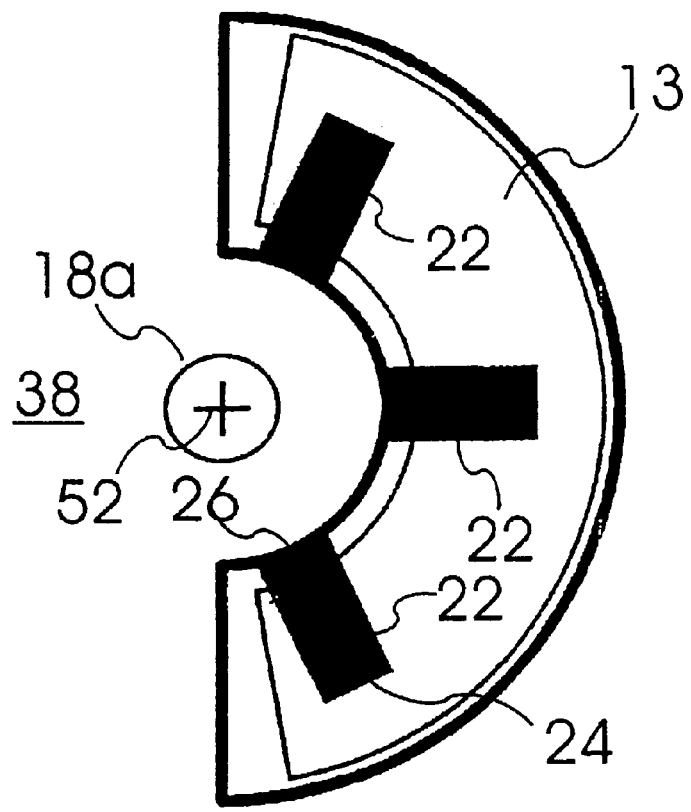
FIGS. 2a and 2b show schematically two orthogonal cross sections of a charged particle beam device in the region between the final focus lens and specimen according to the invention.
Figure 2B:
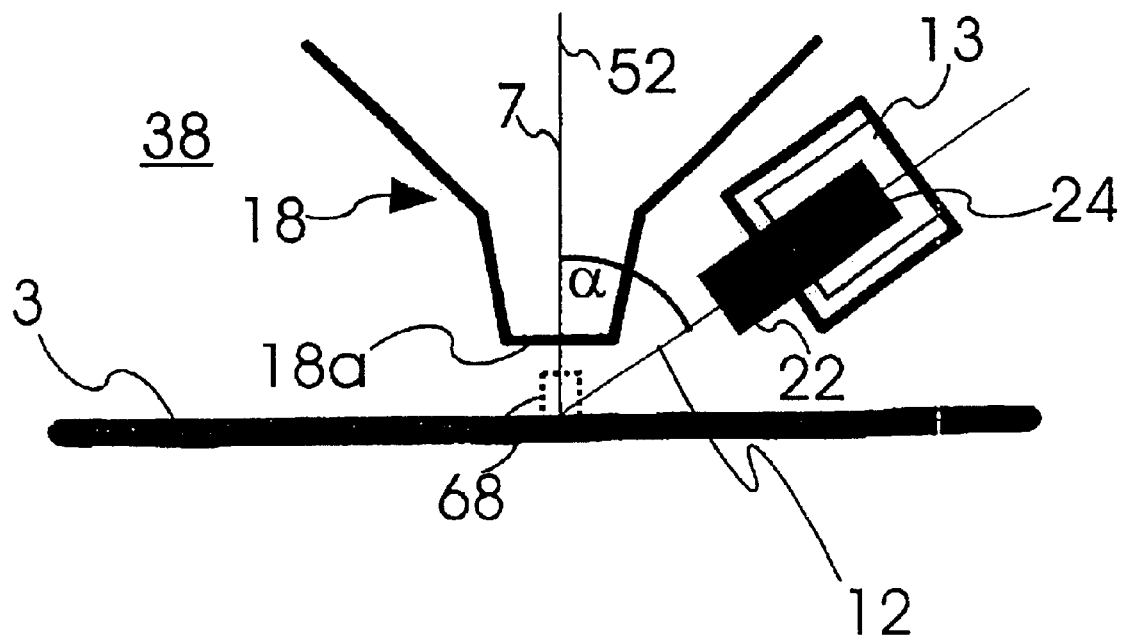

FIGS. 2a and 2b schematically show two cross sections of the region between final focus lens 18 and specimen 3 of the SEM of FIG. 1 in more detail. FIG. 2a represents a cross section in a plane orthogonal to the optical axis 52 of the final focus lens 18 between the objective lens 18 and the specimen 3. FIG. 2b represents a cross section of the same device along the optical axis 52 in the region of the objective lens 52 and the specimen 3. The geometrical parameters in FIG. 2a and 2b serve as an example for demonstrational purposes and are not intended to limit the scope of the invention. In FIGS. 2a and 2b, the optical axis 52 is identical with the path of the charged particle beam 7.

FIG. 2b displays a cross section of the dispensing pressure chamber 13 with a tube plate 22 whose tubes are directed towards the charged particle beam 7, close to the region where the charged particle beam interacts with the specimen 3. This region is marked as "desired region 68". The desired region 68 represents the region within which the gas pressure should be locally increased by means of the gas supply system in order to achieve a high decharging efficiency while keeping the overall pressure of the vacuum chamber low. The desired region 68 is located between the surface of the specimen 3 and a circular lower end 18a of the final focus lens 18 (FIG. 2b) in the region where the charged particle beam 7 impinges onto the specimen 3.

The circular lower end 18a of the final focus lens 18 of FIG. 2b is coaxially aligned around the optical axis 52 of the final focus lens 18. The distance between the lower end 18a of the final focus lens 18 and specimen 3 (i.e. the working distance) is typically between 1 to 2 mm and preferably 1.4 mm. The diameter of the lower end 18a of the final focus lens 18 is made small in order to increase the gas conductance in this region, i.e. to reduce the amount of gas in the vacuum during decharging. The gas conductance between the desired region 68 near the specimen and the vacuum pump is typically in the range between 50 to 200 l/s.

The tubes of the tube plate 22 are oriented at an angle a of about 55 degrees with respect to the optical axis 52. With the angle a smaller than 90, the gas has a larger crossing volume with the charged particle beam to achieve a high ionization efficiency. FIGS. 2a and 2b do not show the individual tubes of the tube plates 22, since they are too small to be drawn on this scale.

Figure 3A:
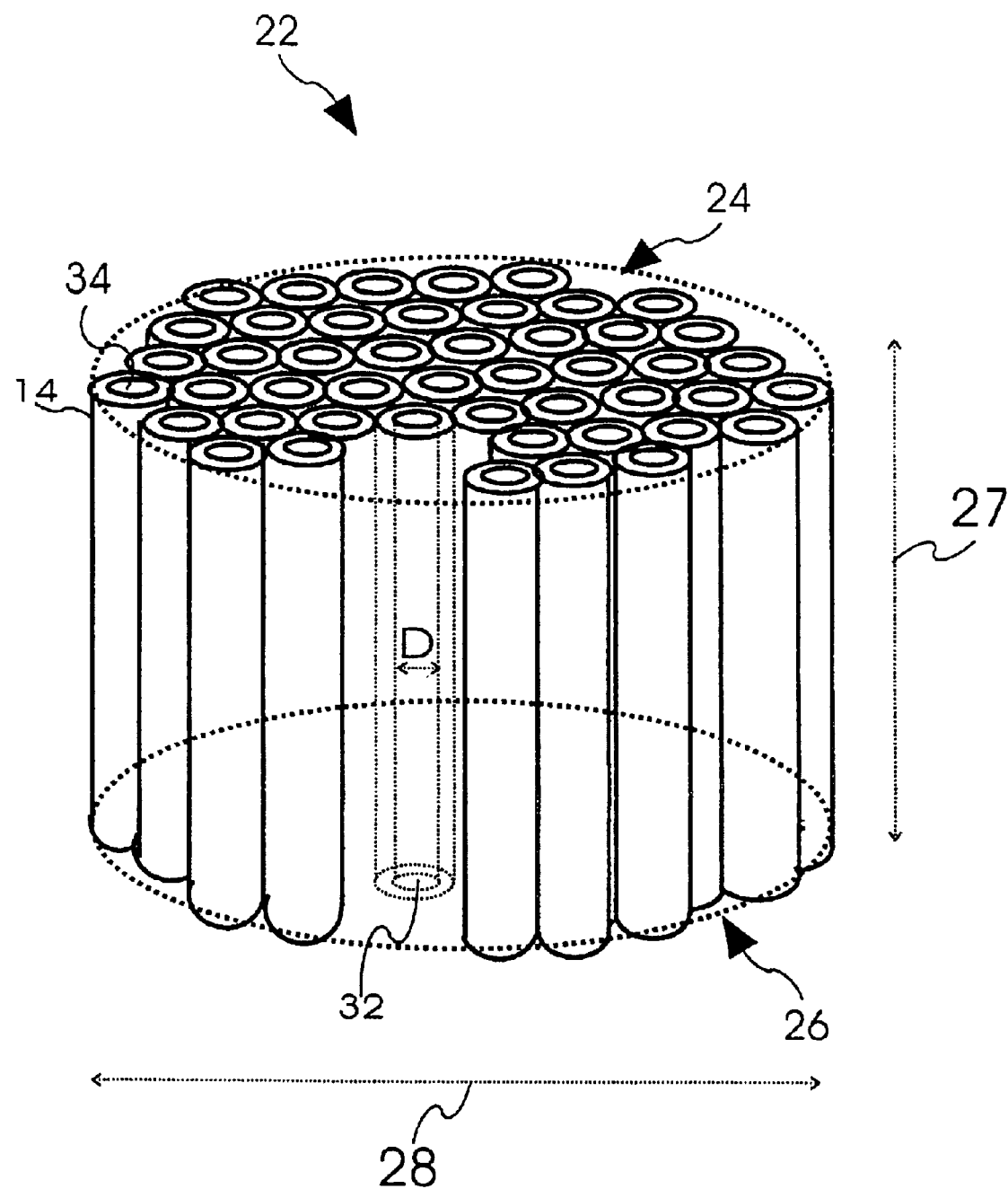
FIG. 3a discloses a tube plate made of a bundle of tubes, according to the invention.

An example of one tube plate 22, which is used for the device of FIGS. 2a and 2b, is shown in FIG. 3a. The tube plate 22 of FIG. 3a has a circular front side 24 and a circular reverse side 26. The diameters of the front side 24 and reverse side 26 in this example are 1.5 mm. The thickness of the tube plate is 4 mm, which represents the length of the tubes 14. The tube plate 22, in this example, comprises 5,000 tubes. Each tube 14 has a (characteristic) diameter, D, of typically 15 $\mu$m. The tubes 14 are essentially oriented in parallel with respect to each other. However, it is possible to align the tubes 14 at given angles to better direct the gas 12 into the thin electron beam 7. More details of the tube plate 22 will be explained later.

The tube plate 22 is further tightly sealed and glued to the dispensing pressure chamber 13 to prevent gas from leaking into the vacuum 38 in channels between the tube plate 22 and the dispensing pressure chamber 13 socket. Preferably, the tube plate 22 is glued to the dispensing pressure chamber socket 13 at some distance away from the inlets or outlets of the tube plate 22 in order to prevent the tube inlets or outlets from becoming clogged by the glue during gluing. The glue needs to be vacuum compatible.

In order to further increase the number of tubes, the SEM 1 has three tube plates 22 integrated into the dispensing pressure chamber 13 (see FIG. 2a). The three tube plates 22 are circularly arranged around the optical axis 52 of the final focus lens 18 in order to provide gas from three different locations to decharge the specimen 3. The angle between the three tube plates 22 in FIG. 2a is 60 degrees. Accordingly, the three tubes cover a total angle of 120 degrees. A 120 degree geometry of the tube plates is advantageous in comparison to a fully circular arrangement, since the 120 degree arrangement leaves space open for the directed gas to easily flow away from the region between specimen and objective lens once it has passed the electron beam, i.e. the 120 degree geometry of the tube plates provides a high conductance value for the region between the objective lens 18 and the specimen 3.

FIG. 2a further indicates that the three tube plates 22 are connected to the same dispensing pressure chamber 13. In this way, the front sides 24 of the tube plates 22 are exposed to the same dispensing pressure provided by the dispensing pressure chamber 13. This enables the same gas flow from the three tube elements 22, provided that the geometry of the tube elements 22 and tubes are the same. In one preferred embodiment, the volume of the dispensing pressure chamber 13 is preferably larger than the volume of all tubes 14 together by a factor of 5 and preferably larger by a factor of 10, in order to have a stable dispensing pressure independent of the gas load.

Not shown in FIGS. 2a and 2b are the gas supply unit 11 which delivers the gas to the dispensing pressure chamber 13, and the pressure control unit 70 which adjusts the dispensing pressure in the dispensing pressure chamber 13. However, a person skilled in the art would know how to connect a gas supply unit 11 to the dispensing pressure chamber 13. He would also know how to reduce the pressure of the gas supply unit 11 to a desired dispensing pressure in the dispensing pressure chamber 13, in order to direct a desired amount of gas 12 into the charged particle beam 7, e.g. the pressure control unit 70 can be a simple pressure reduction valve which reduces the pressure mechanically. However, the pressure control unit 70 can also be an electronically controlled device, e.g. to adjust the dispensing pressure dynamically according to the electron beam intensity. An electronically controlled pressure control unit 70 would be able to open and close the connection between gas supply unit and dispensing pressure chamber at high speed for pulsing the gas flow.

FIG. 3a schematically shows a circular tube plate 22 of FIGS. 2a and 2b in more detail. The tube plate 22 has a tube plate thickness 27 of 4 mm and a tube plate diameter 28 of 1.5 mm. It comprises about 5,000 tubes with a tube length, L, that corresponds to the tube plate thickness 27 of 4 mm. The inner characteristic diameter, D, of the tubes is typically 15 $\mu$m, whereby the inner characteristic diameter, D, refers to the inner cross section area, A, of the outlet of a tube 32. The total inner cross section area, $A_T$, of the tube plate 22 is therefore about $0.9 \times 10^6$ $\mu m^2$.

Preferably, the tubes 14 have a constant inner cross section diameter, D, along the longitudinal axis within 1%. The thickness of the tube walls is small enough to provide an open area fraction of typically 50%. The open area fraction is equivalent to the transmission fraction. Typically the tubes 14 are oriented parallel to each other within 0.5 degrees, however, it is also possible to have them aligned to each other at some well defined angle to improve the aiming accuracy of the tubes into the electron beam.

Typically, the tube plate is constructed from tubes made of glass or glass ceramic. However, the invention is not limited to those materials. In order to achieve a small desired inner cross section area, A, for the tubes, tubes of a given larger cross section area are bundled, heated and stretched. The stretching causes the tubes to decrease their diameters. The bundling, heating and stretching cycle may be repeated several times until the tubes reach the desired diameters. When the tubes have a desired tube diameter, the bundle of tubes is cut into equal slices to obtain several bundles of tubes of a desired bundle length, L. The many bundles of tubes are then glued together in parallel to obtain a tube plate with a given number of tubes, as shown in FIG. 3. This method allows the tube plates 22 to be fabricated with a transmission of typically 50%. The transmission of a tube plate is defined as the ratio of the open area of the tube plate to the area that is closed due to the walls of the individual tubes.

Figure 3B:
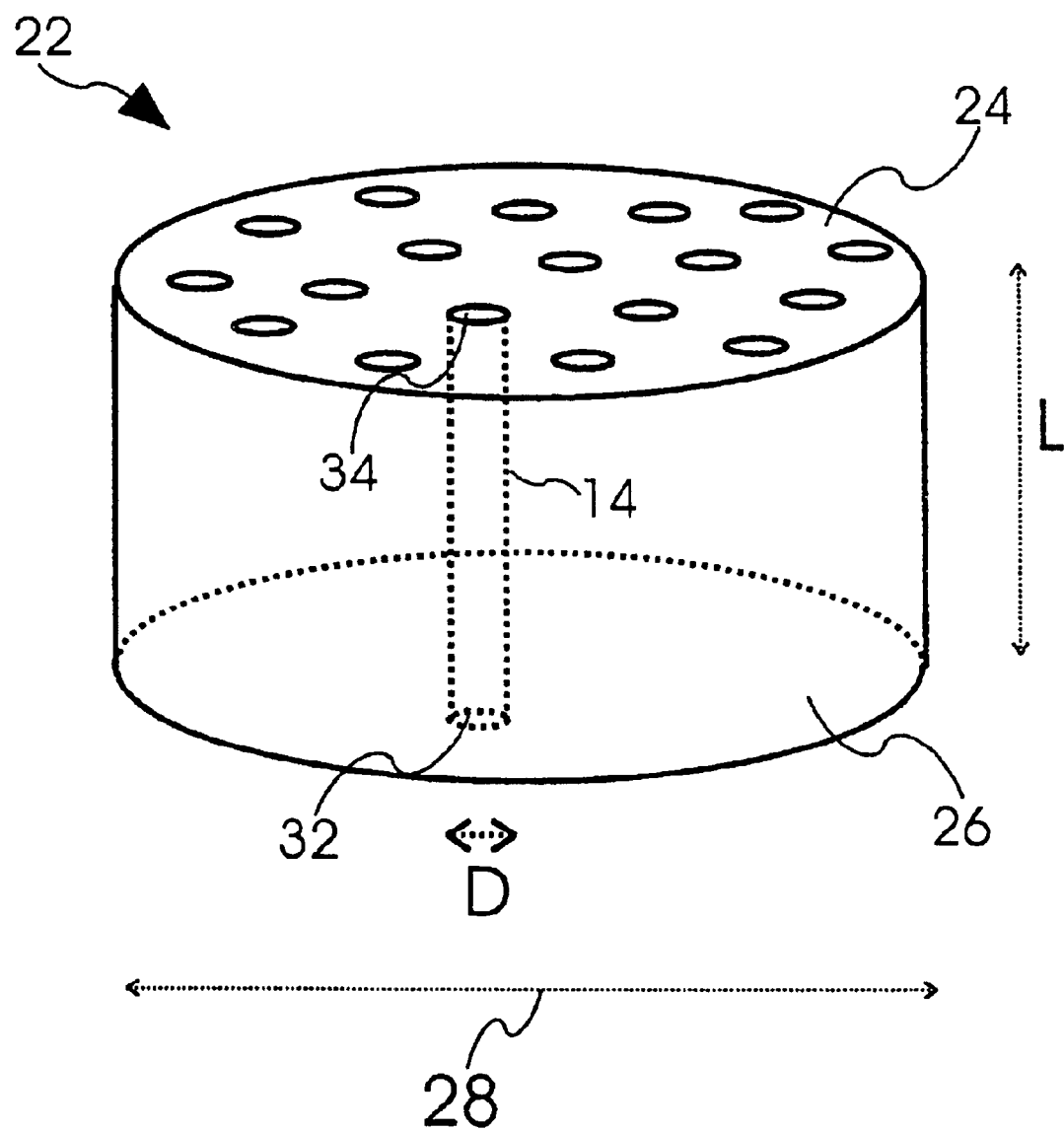
FIG. 3b discloses a tube plate with the tubes etched through the tube plate, according to the invention.

FIG. 3b discloses another type of tube plate. In this example, the tube plate 22 consists of silicon through which holes or pores of a given diameter are etched. The length of the holes, L, is defined by the thickness of the silicon wafer from which the tube plate is taken. The wafers can be as thick as several hundred micrometers. The diameter of the holes, D, is defined by the etching parameters that generate the holes. The etching of holes in silicon is described, e.g. in the U.S. Pat. No. 5,139,624. U.S. Pat. No. 5,139,624 discloses an electrolytic etching of silicon which allows the pores to be etched through the wafer with pore diameters that can be chosen to be in the range between 20 angstroms to several micrometers.

In Table I, operational parameters for two SEM systems using different decharging gas supply systems for decharging a wafer 3 are disclosed. The gas supply system A refers to a prior art gas supply system having one tube with an inner diameter D of 100 $\mu$m (corresponding to a total inner cross section area, $A_T$, of $7.8 \times 10^3$ $\mu m^2$) and a tube length of 20 mm. The gas supply system B, in contrast, refers to a gas supply system according to the invention having 3 tube plates with 5,000 tubes each, each tube having an inner diameter, D, of 15 $\mu$m (corresponding to a total inner cross section area, $A_T$, of $2.7 \times 10^6$ $\mu m^2$) and a tube length of 4 mm.

For both SEM systems, the regions between the final focus lens 18 and the specimen 3 are equal which implies that the conductance for the gas in the regions is equal. The region between the final focus lens 18 and the specimen 3 is characterized by a distance of 1.4 mm between the specimen 3 and the lower end of the final focus lens, and by a diameter of the lower end of the final focus length 18a of 2 mm (see FIG. 2b). Further, all operational parameter values in Table I are normalized to the condition that, a) the gas pressure in the vacuum chamber is $1 \times 10^{-4}$ mbar, b) the gas used to discharge the specimen is nitrogen at 300 K; and c) the pumping power is 150 l/s within the vacuum chamber. The given pumping power and vacuum chamber pressure result in a total gas flow of $15 \times 10^{-3}$ mbar l/s for both gas supply systems.

For the gas supply system A, a dispensing pressure of 100 mbar was used to provide the total gas flow of $15 \times 10^{-3}$ mbar l/s. In this case, the free path length, $\lambda$, is about 0.6 $\mu$m which is much shorter than the inner diameter, D, of the tube of 100 $\mu$m, i.e. the gas within the tube is said to be operated in the turbulent mode where the peaking-ratio is essentially 1. With such a low peaking-ratio, the precision for directing the beam into the charged particle beam is low, i.e. the gas exits the tube within a wide angle and, accordingly, the pressure at the specimen is essentially the same as in the vacuum chamber.

A comparison of the above mentioned operational parameters with the one of the gas supply system B illustrates the advantage of a gas supply system with multiple tubes. For the same total gas flow of $15 \times 10^{-3}$ mbar l/s, the pressure at the specimen is 10 times higher for the gas supply system B than for the gas supply system A. A high ratio of the pressure at the specimen to the average pressure of the chamber vacuum reflects the ability to direct the gas with high spatial precision into the primary charged particle beam where the gas becomes ionized to decharge the specimen. Therefore, the efficiency for decharging the specimen is improved in gas supply system B, i.e. the decharging capability is higher for the same total gas flow, or, vice versa, the total gas flow can be reduced to obtain the same decharging capability.

The high spatial precision for directing the gas into the charged particle beam is due to the high peaking-ratio of the gas supply system B (peaking-ratio 10), compared to the peaking ratio of 1 for the gas supply system A. The peaking-ratio in turn is high because the dispensing pressure of 1 mbar and the inner diameter, D, of the tubes (D=15 $\mu$m) are so small that the free path length, $\lambda$, of the gas ($\lambda$=60 $\mu$m) is larger than the inner diameter of the tubes. With a free path length, $\lambda$, larger than the inner diameter but smaller than the tube length, L, the gas is said to be operated in the opaque mode.

A further reduction of the dispensing pressure results in an even larger free path length, $\lambda$, and, accordingly, in an even higher peaking-ratio. For a dispensing pressure of 0.01 mbar, the free path length, $\lambda$, is 6000 $\mu$m. 6000 $\mu$m is much larger than the diameter D of the tubes and larger than the length, L, of the tubes. In this case, the gas is said to be operated in the molecular mode where the peaking-ratio is about 200, and the efficiency of directing the gas into the primary charged particle beam increases accordingly. As a result, the gas flow axially to the tubes is reduced by a factor of 100—proportionally to the pressure reduction—whereas the full gas load is reduced by a factor of 2000, due to the additional increase of the peaking-ratio.

TABLE I

| Gas Supply System | A | B |
| --- | --- | --- |
| Total number of tubes | 1 | 15,000 (3 × 5,000) |
| Dispensing pressure (mbar) | 100 | 1 |
| Inner diameter of tube D ($\mu$m) | 100 | 15 |
| Total inner cross section area $A_T$ ($\mu m^2$) | $7.8 \times 10^3$ | $2.7 \times 10^6$ |
| Length of tubes L (mm) | 20 | 4 |
| Free path length $\lambda$ ($\mu$m) | ca. 0.6 (turbulent) | 60 (opaque) |
| Peaking-ratio | 1 | 10 |
| Total gas flow (mbar l/s) | $15 \times 10^{-3}$ | $15 \times 10^{-3}$ |
| Pressure in vacuum cleaner (mbar) | $1 \times 10^{-4}$ | $1 \times 10^{-4}$ |
| Max. pressure at specimen (mbar) | $1 \times 10^{-4}$ | $10 \times 10^{-4}$ |

What is claimed is:

1. A charged particle beam device for inspecting or structuring a specimen, comprising:
   a) a charged particle beam source configured to generate a charged particle beam;
   b) a beam optical system configured to direct the charged particle beam onto the specimen; and
   c) a gas supply system configured to provide a gas for the charged particle beam device, wherein the gas supply system comprises a plurality of at least ten tubes to direct the gas towards a desired region for interaction with the specimen.

2. The charged particle beam device according to claim 1, wherein the length, L, of each tube is larger than the square root of the inner cross section area, A, of the tube by more than about 5 times.

3. The charged particle beam device according to claim 1, wherein the gas supply system comprises a plurality of more than about 100 tubes to direct the gas.

4. The charged particle beam device according to claim 1, wherein the desired region is disposed between the specimen and a circular lower end portion of the beam optical system and comprises a region where the charged particle beam impinges onto the specimen.

5. The charged particle beam device according to claim 1, wherein the charged particle beam device provides a vacuum with a pressure lower than about $1 \times 10^{-3}$ mbar.

6. The charged particle beam device according to claim 1, wherein the inner cross section area, A, of each tube varies along the tube length, L, by less than a factor of about 4 compared to the cross section area, A, at the outlet of the tube.

7. The charged particle beam device according to claim 1, wherein the inner cross section area, A, at the outlet of each tube of the plurality of tubes is smaller than about 50,000 $\mu m^2$.

8. The charged particle beam device according to claim 1, wherein the inlets of the tubes are positioned within a dispensing pressure chamber.

9. The charged particle beam device according to claim 1, wherein the at least ten tubes are oriented essentially in parallel to each other.

10. The charged particle beam device according to claim 1, wherein the tubes of the plurality of tubes are arranged as a bundle of tubes.

11. The charged particle beam device according to claim 10, wherein the bundle of tubes form a tube plate with the tubes reaching from the front side of the tube plate to the reverse side of the tube plate.

12. The charged particle beam device according to claim 11, wherein the density of tube outlets on the reverse side of the tube plate is within the range of about $10^2$ 1/cm$^2$ to about $10^7$ 1/cm$^2$.

13. The charged particle beam device according to claim 11, wherein the plurality of tubes comprises at least two tube plates.

14. The charged particle beam device according to claim 13, wherein the at least two tube plates are arranged in a semicircle around the optical axis of a final focus lens configured to focus the charged particle beam onto the specimen.

15. The charged particle beam device according to claim 13, wherein the gas is a neutral gas when passing through the tubes.

16. The charged particle beam device according to claim 15, wherein the neutral gas is at least one of $N_2$, an inert gas or a mixture of the above mentioned gases.

17. The charged particle beam device according to claim 16, wherein the inert gas comprises at least one of He, Ne, Ar, Kr, Xe and $CH_4$.

18. The charged particle beam device according to claim 13, wherein the at least ten tubes are positioned in the vicinity of the specimen.

19. The charged particle beam device according to claim 1, wherein the length of each tube is larger than the diameter of the inner cross section, A, of each tube by at least a factor of about 10.

20. The charged particle beam device according to claim 19, wherein during normal operation, the free path length of the gas at the outlet of each tube is larger than 1/10 of the length of the tube, L.

21. The charged particle beam device according to claim 1, wherein during normal operation, the peaking-ratio of the gas at the outlet of each tube of the plurality of tubes is larger than two.

22. The charged particle beam device according to claim 1, wherein during normal operation, the pressure at the inlet of each tube is smaller than 10 mbar.

23. The charged particle beam device according to claim 1, wherein the beam optical system comprises a final focus lens to focus the charged particle beam onto the specimen.

24. The charged particle beam device according to claim 23, wherein during normal operation, the plurality of tubes directs the gas into the charged particle beam in the region between the final focus lens and the surface of the specimen.

25. The charged particle beam device according to claim 23, wherein the tubes of the plurality of tubes are arranged at an angle, $\alpha$, smaller than 60 degrees with respect to the optical axis of the final focus lens to direct the gas towards the specimen.

26. The charged particle beam device according to claim 23, wherein the beam optical system comprises a reference electrode to generate an electric field to accelerate an ionized gas towards the specimen.

* * * * *

UNITED STATES PATENT AND TRADEMARK OFFICE
CERTIFICATE OF CORRECTION

PATENT NO. : 6,900,443 B2  Page 1 of 1
APPLICATION NO. : 10/757354
DATED : May 31, 2005
INVENTOR(S) : Hartmut Schlichting It is certified that error appears in the above-identified patent and that said Letters Patent is hereby corrected as shown below:

On the Title Page

Item [83], Assignee: Change Assignee's name from "ICT, Integrated Circuit Testing Geaellshaft fur" to --ICT, Integrated Circuit Testing Gesellshaft fur--

In the Specification

Column 1, Line 61: Insert a comma after "described"

Column 1, Line 61: Insert a comma after "e.g."

Column 15, Line 18: Change "Jongitudinal" to --longitudinal--

Signed and Sealed this

Fifth Day of September, 2006

JON W. DUDAS
*Director of the United States Patent and Trademark Office*